Figure 1:
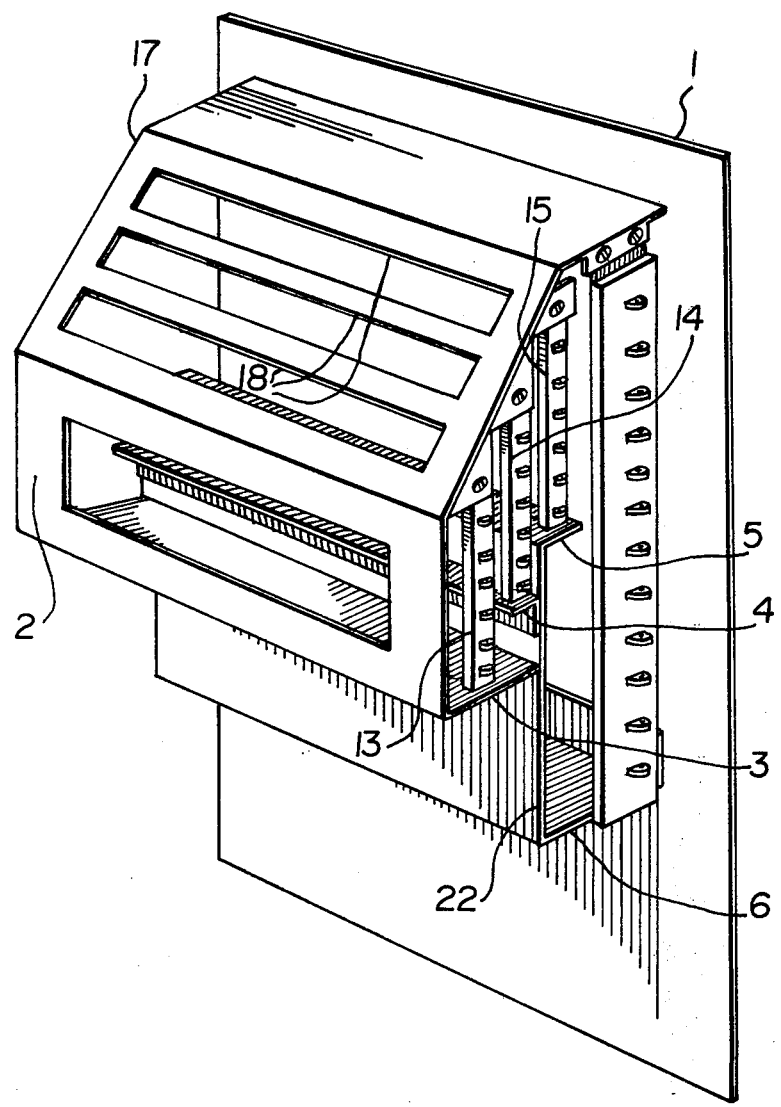

United States Patent [19]

Beirn et al.

[11] 4,304,966
[45] Dec. 8, 1981

[54] PBX FIELD DISPLAY

[75] Inventors: Patrick R. Beirn, Stittsville; Terrence H. Matthews, Kanata, both of Canada

[73] Assignee: Mitel Corporation, Kanata, Canada

[21] Appl. No.: 83,076

[22] Filed: Oct. 9, 1979

[30] Foreign Application Priority Data

Aug. 23, 1979 [CA] Canada .................................. 334303

[51] Int. Cl.³ .......................................... H04M 1/00
[52] U.S. Cl. ............................ 179/1 MN; 179/27 FC; 179/179; 361/415
[58] Field of Search ....................... 361/395, 401, 415; 179/1 MN, 91 R, 97, 98, 100 R, 81 C, 84 L, 179, 27 FC; 340/366 E, 372, 381, 718, 719

[56] References Cited

U.S. PATENT DOCUMENTS

| 2,546,647 | 3/1951 | Marble et al. | 179/94 |
| 2,945,989 | 7/1960 | Vogel et al. | 361/415 |
| 3,573,558 | 6/1969 | Babcock | 361/415 |
| 3,764,857 | 10/1973 | Bartlett et al. | 361/415 |
| 3,766,550 | 10/1973 | Vandemore et al. | 361/415 |
| 3,944,752 | 3/1976 | Stearn et al. | 179/1 MN |
| 3,992,654 | 11/1976 | Springer et al. | 361/415 |
| 4,151,580 | 4/1979 | Struger et al. | 361/415 |
| 4,203,148 | 5/1980 | McComas | 361/415 |

Primary Examiner—Bernard Konick
Assistant Examiner—Randall P. Myers
Attorney, Agent, or Firm—Alan H. Levine

[57] ABSTRACT

A PABX control circuitry housing which functions both as a housing for the circuitry and also as an indicator console, and can be mounted either on a wall or a desk top. To achieve a narrow, inobtrusive cabinet which can be used in this way, printed circuit boards are mounted parallel to the front of the housing. Indicators such as light emitting diodes (LEDs) are mounted along one edge of each of the printed circuit boards retained within the housing. The printed circuit boards are retained on successively stepped ledges, which causes the edges containing the LEDs on each of the boards to be visible from the front of the housing. A darkened, preferably translucent window in the housing allows the operator to view the LEDs. A silk screened or other imprint on the window provides the operator an indication of the meaning of the lit LEDs.

13 Claims, 5 Drawing Figures

PBX FIELD DISPLAY

BACKGROUND OF THE INVENTION

This invention relates to a housing for printed circuit boards, whereby the printed circuit boards are mounted so as to provide an indicator display for functions performed by circuits mounted thereon.

PABX telephone systems typically utilize a desk mounted console which includes an attached handset for use by an operator. The console includes a pushbutton field, and a field of lights which indicate which lines and/or trunks are in use, and often other information such as the time, class of service, the status of an alarm situation, etc. The main PABX equipment is retained either in a separate equipment room, or in a console cabinet which is located in an out-of-the-way or out-of-sight location.

On the other hand, other call distribution systems, for example key telephone systems utilize pushbutton telephones which have access to various lines, and have equipment cabinets attached to desks, etc., also in an out-of-the-way and out-of-sight location. The indicators on such systems are on the key telephones themselves, and are restricted to the lit-up pushbuttons which indicate lines in use.

It has been found, however, that for PABX systems which control lines similar or larger in number than key telephone systems, but not as large as middle-sized PABX systems, yet which offer features of PABX systems more sophisticated than key telephone systems, it is uneconomical to provide an operator console. Yet it is important to provide indicators and controls to an operator not only as to line status, but also for the more sophisticated functions of a PABX.

SUMMARY OF THE INVENTION

The present invention is directed to an equipment housing which is small, to accommodate the equipment required in a very small PBX, yet provides means for the operator to obtain the indicated information from a display field while using only a standard key telephone station set for control, rather than a special PABX desk console. Means is provided for mounting printed circuit boards in a special way within a control housing which can be mounted on a wall beside the operator's desk or can lie on the operator's desk. To achieve a narrow, inobtrusive cabinet which can be used in this way, the printed circuit boards are mounted parallel to the front of the housing. The indicators such as light emitting diodes (LEDs) are mounted along one edge of each of printed circuit boards retained within the housing. The printed circuit boards are retained on successively stepped ledges, which causes the edges containing the LEDs on each of the boards to be visible from the front of the housing. A darkened, preferably translucent window in the housing allows the operator to view the LEDs. A silk screened or other imprint on the window provides the operator an indication of the meaning of the lit LEDs.

In this way the PABX equipment housing serves multiple duty as a housing for the equipment and as an indicator console, allowing the cost of the system to be considerably reduced by eliminating the requirement for a separate PABX operator console, and allowing the operator to use a standard key telephone set for control.

Due to the upper edges of successive printed circuit boards which carry the LEDs being stepped, the operator can observe the entire LED field from a single location, since the equipment cabinet is preferably formed so as to have its window sloped, and located directly over the LEDs.

The invention, more particularly, is a printed circuit board housing comprising a chassis, means for retaining a plurality of printed circuit boards in substantially parallel relationship on the chassis, the chassis including a plurality of ledges having different heights for supporting respective ones of the boards at different heights whereby the edges of successive ones of the boards extend past preceding ones of the boards so as to allow predetermined components mounted adjacent the edges of all of the boards to be visible from a position forward of the front one of the boards.

More generally, the invention is a printed circuit board chassis comprising a structure for supporting a plurality of printed circuit boards which have indicators mounted adjacent an edge of each board. The structure for supporting the boards retains said edges at successively advancing positions whereby the indicators of all of the boards are made visible from one position relative to the chassis.

INTRODUCTION TO THE DRAWINGS

Figure 2:
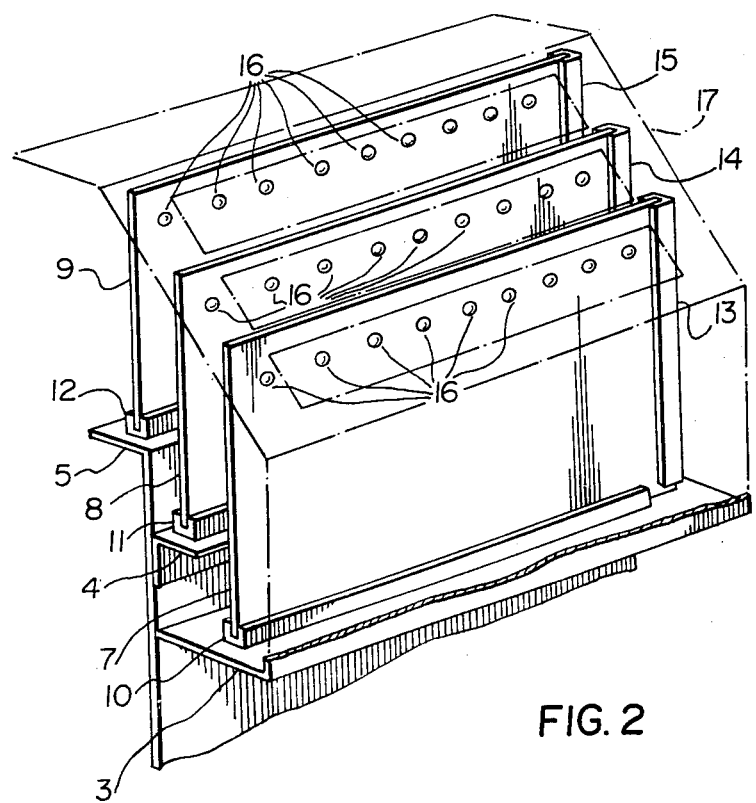
Figure 3:
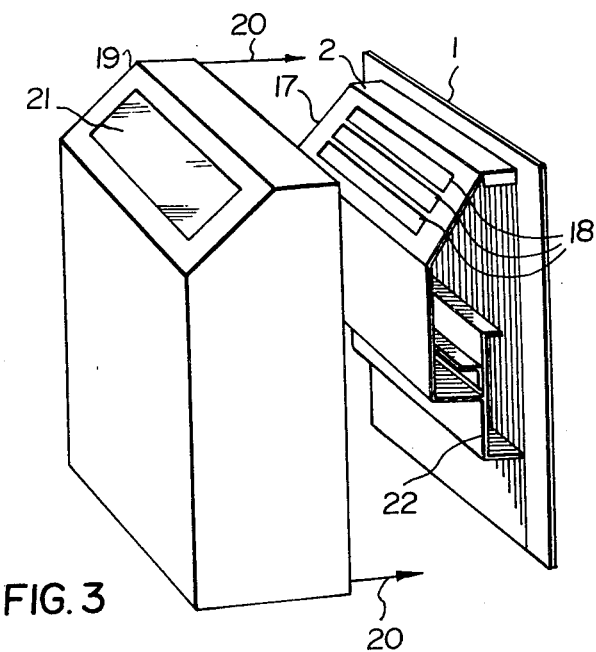
Figure 4:
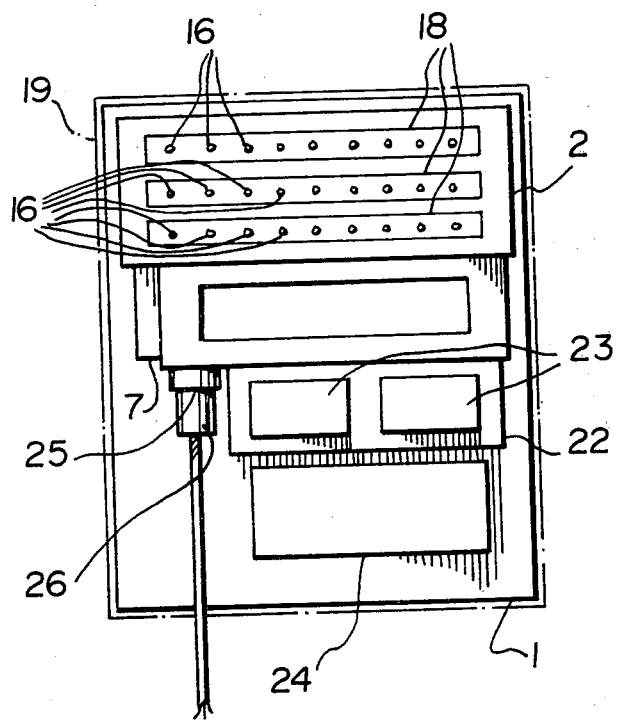
Figure 5:
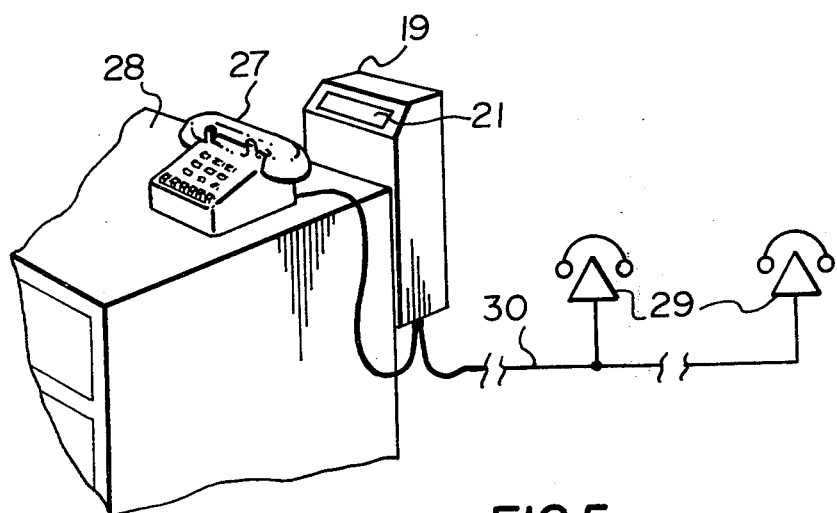

A better understanding of the invention will be obtained by reference to the detailed description below, and to the following drawings, in which:

FIG. 1 is a perspective view of a preferred embodiment of the chassis in the invention, FIG. 2 is a perspective view of a shelf portion of the chassis from a different angle than FIG. 1, showing printed circuit boards in position, FIG. 3 is a perspective view of the chassis with a housing cover, FIG. 4 is a front elevation of the chassis with equipment mounted thereon, and FIG. 5 is a representative view of various elements of a PABX utilizing the invention.

DESCRIPTION OF THE INVENTION

Turning first to FIG. 1, the preferred embodiment of the invention includes a mounting panel 1, which preferably is comprised of a piece of sheet steel having key slots (not shown) which can be used to accommodate screws for mounting the entire assembly on a wall.

Extending forward of the panel 1 is a chassis 2. The chassis is comprised of shelves 3, 4 and 5, and, if desired, shelf 6. The number of shelves is not critical. However a chassis having three successively higher shelves to accommodate printed circuit boards of standard height has been found to be a good number for use in a small PABX of up to, for example, a total of 50 lines and trunks.

The side of each of the shelves which is hidden from view in FIG. 1 is left open, to allow printed circuit boards to be slid in vertically, with their bottom edges against corresponding shelves. The shelves are of course spaced laterally sufficiently to allow room for components mounted on the printed circuit boards.

Looking at FIG. 2 in combination with FIG. 1, printed circuit boards 7, 8 and 9 are shown in position on shelves 3, 4 and 5 respectively. Printed circuit board tracks 10, 11 and 12 mounted on the shelves can be used to help guide the printed circuit boards into proper position, but these are not absolutely necessary.

At the end of each of the respective shelves, printed circuit board connectors 13, 14 and 15 are disposed, with their planes orthogonal to the planes of the shelves, and their central axes parallel to or coincident with the central axes of the corresponding shelves. FIG. 2 shows the printed circuit boards in position retained by connectors 13, 14 and 15.

Preferably printed circuit board locks (which are well known) can be used to hold the boards in position, and they will be found to hold the boards even more securely where tracks 10, 11 and 12 are used.

Indicators 16 are attached to printed circuit boards 7, 8 and 9 adjacent their upper edges. Preferably the indicators are light emitting diodes, but other forms of indicators, preferably light emitting indicators, can be used. It will be seen, particularly from FIG. 2, that with each of the printed circuit boards supported by the corresponding shelves, the indicators of successively rearward boards protrude above the boards immediately in front. This allows viewing of the indicators from a position forward of the front-most board.

It should be noted in case the printed circuit boards are designed to be of different heights, the shelf heights can be at levels so as to accommodate the different board sizes, but still retain the positions of the indicators at successively higher levels toward the rear of the chassis. All of the shelves can be at the same level should the heights of the boards be made increasingly larger toward the rear of the chassis.

While in the preferred embodiment, the printed circuit boards are slid on the shelves to mate with connectors 13, 14 and 15 on one side thereof, the connectors alternatively can be fixed on the shelves facing upwardly. In this case the printed circuit boards should be inserted from above, mating with the connectors as the boards are pushed downward. Edge guides can be used to hold the boards in position. The chassis should then be open from above to allow insertion of the printed circuit boards or the upper portion of the chassis should allow sufficient clearance for insertion of the boards.

In the preferred embodiment the chassis is formed with a sloped panel 17 in a plane which is about parallel to a plane touching the top edges of two of the boards, e.g., the front and rear boards, although other slopes can be used. The slope is to allow viewing windows of the chassis to be approximately equidistant from the indicators.

In the preferred embodiment, the sloped panel contains windows 18 to allow viewing of the indicators therethrough. It is preferred that windows should be used in the chassis in order that the remaining opaque regions of the sloped panel should mask light which might otherwise reflect from the boards or from other components mounted on the printed circuit boards. Should the material of the chassis be light reflecting, a dark light-diffusing adhesive tape can be applied to the outer surface thereof in order that it should appear dark.

Turning now to FIG. 3, the chassis 2 is affixed to mounting panel 1, but without the printed circuit boards or connectors, is shown with a housing cover 19 in front thereof. Arrows 20 show how the housing cover 19 is applied to cover the chassis 2. Well-known fastening means such as clips or the like can be used to fasten housing cover 19 to mounting panel 1.

The top front surface of housing cover 19 is sloped to match the slope of the panel 17, and a window 21 of plexiglass, glass, or other transparent material is centrally located in the sloped section. The window 21 is located directly over the windows 18 of the chassis in order to facilitate viewing of the indicators adjacent the top edges of the printed circuit boards, by an operator.

Preferably the window 21 is darkened, translucent, smoked or the like in order to allow only the light emitted from the indicators to pass outwardly for viewing purposes, yet to impede reflected light from inside the housing cover from being seen. To facilitate this, the window 21 can be polarized.

Window 21 may carry indicia or other silk screened or energized information which designates to the operator which light emitting diodes are lit, by number or title, to facilitate control of the equipment.

FIG. 4 is a front elevation of the chassis 2 with various components attached thereto. The front-most printed circuit board 7 is shown in its retained position, past a cutout in the chassis 2. Indicators 16 such as light emitting diodes are visible through windows 18.

As may be seen more clearly in FIGS. 1 and 3, the chassis is formed with a step 22, and as shown in FIG. 4, a pair of circuit modules 23 are mounted on step 22. These modules can be telephone ringing generators for the PABX, etc.

Below the chassis, on the mounting panel 1 a further circuit module 24 such as a power supply can be mounted. If desired, of course, the chassis below the portion holding the printed circuit boards can be of some other useful form.

Preferably the step 22 is indented from the left to accommodate a socket 25, into which plug 26 is mated. Connection of the telephone sets and key telephone set to the PABX can be made via plug 26 and socket 25. The housing cover 19 is shown in dashed outline, in position surrounding the chassis.

FIG. 5 shows a typical installation of the invention. A key telephone set 27 of standard type is located on the desk 28 of an operator. The mounting panel and chassis retaining the printed circuit boards and circuit modules is fastened to the wall, and the housing cover 19 is clipped, screwed, or otherwise fastened to the mounting panel. It should be noted that window 21 is clearly visible to the operator position, by which she can observe illumination of the light emitting diodes internal to the housing, mounted on the printed circuit boards.

Alternatively the structure can lie on the operator's desk with the window facing forward. Indeed in some installations the structure can be placed in the operator's desk drawer, with the window position of the housing protruding for observation by the operator. The structure can also be inserted in place of the desk drawer. combination equipment holder and display, eliminating the requirement for a PABX console, allowing a standard key telephone set to be used in conjunction therewith for control of the PABX.

Other telephone sets 29 are connected via cable 30 to the PABX via plug 26 and socket 25 described earlier.

The advantages of the invention can also be obtained by mounting the printed circuit boards in other configurations, for example horizontally with their front edges stepped so as to allow an operator an unrestricted view of the printed circuit board indicators. The shelves or ledges can also be provided in configurations other than in the configuration shown in FIG. 2. For example, all of the shelves can be extended from a rear panel of the chassis, decreasing in width from the rear panel from lower to upper shelves. Further, configurations may be desirable and can be designed in which the printed circuit boards are not in parallel disposition.

All such variations, modifications and other embodiments utilizing the principles of the invention are deemed to be within the sphere and scope of the present invention, as defined in the claims appended hereto.

We claim:

1. A printed circuit board housing comprising a chassis, means for retaining a plurality of printed circuit boards in substantially parallel relationship on said chassis, the chassis having a plurality of ledges of different heights for supporting respective ones of said boards at different heights, whereby the edges of successive ones of said boards extend past preceding ones of said boards so as to allow electrical visual indicator means mounted adjacent the edges of respective ones of said boards to be visible from a forward position which is in front of and in a plane parallel to the front one of said boards.

2. A printed circuit board housing as defined in claim 1, in which said ledges are stepped successively upwardly rearwardly of said forward position.

3. A printed circuit board housing as defined in claim 1 or 2 further including a connector disposed upon and facing upwardly from said ledges, adapted to connect to and retain each of said boards.

4. A printed circuit board housing as defined in claim 1 or 2 further including connectors adapted to retain and connect to corresponding ones of said boards and mounted so as to support said boards on said ledges.

5. A printed circuit board housing as defined in claim 2 further including connectors adapted to retain and connect to corresponding ones of said boards and a housing cover for enclosing the chassis having a window opening located adjacent said edges, whereby said electrical visual indicator means can be viewed through said window from a position outside to said cover.

6. A printed circuit board housing as defined in claim 5, further including a darkened but light transmissive window covering said window opening, the window covering being adapted to substantially impede the viewing of reflected light from said boards and said electrical visual indicator means mounted on said boards, but to transmit light directly emitted from said electrical visual indicator means which are mounted on said boards.

7. A printed circuit board housing comprising a chassis, the chassis having a plurality of successively stepped ledges of increasing height rearwardly of the chassis, a plurality of printed circuit boards each supported by one of said ledges, the chassis having a sloped cover in front of the top edges of said boards in a plane about parallel to a plane meeting the top edges of two of said boards, said cover containing holes positioned in front of said indicator means whereby said indicator means can be visible through said holes from a position in front of said chassis in a plane parallel to the front one of said boards while at the same time remaining components on said boards are substantially masked from view by said cover.

8. A printed circuit board as defined in claim 7 further including a housing cover enclosing the chassis having a window positioned in front of said holes, the window being darkened and adpated to substantially block reflection of light from within said cover, but to transmit light from said light emissive indicator means for viewing outside of said cover.

9. For use in a telephone PABX system, the combination of:
(a) a first key telephone set located at an operator position,
(b) a printed circuit board housing including a housing cover having a window, mounted in a location by which the window is visible from said operator position,
(c) said housing comprising a chassis, means for retaining a plurality of printed circuit boards in substantially parallel relationship on said chassis, the chassis including ledge means for supporting respective ones of said boards in a manner whereby the edges of successive ones of said boards extend past preceding ones of said boards so as to allow electrical visual indicator means mounted adjacent the edges of said boards to be visible from a position forward of the front one of said boards, the window being positioned adjacent said indicator means whereby the indicator means can be viewed by said operator to facilitate control of the PBX.

10. A combination as defined in claim 10, in which the indicator means is comprised of light emissive indicators, the chassis having a plurality of successively stepped ledges of increasing height toward the rear of the chassis, a plurality of printed circuit boards each supported by one of said ledges, said light emissive indicators mounted adjacent the top edge of predetermined ones of said boards, the chassis having a sloped cover in front of the top edges of said boards in a plane about parallel to a plane touching the top edges of two of said boards, said cover containing holes positioned in front of said light emissive indicators whereby said light emissive indicators can be viewed through said holes from a position in front of said chassis while at the same time remaining components on said boards are substantially masked from view by said cover.

11. A combination as defined in claim 10, in which the said window is positioned in front of said holes, the window being darkened and adapted to substantially block reflection of light from within said cover, but to transmit light from said light emissive indicators for viewing outside of said cover.

12. A printed circuit board chassis comprising means for supporting a plurality of printed circuit boards in planes parallel to each other, each of the boards having electrical visual indicator means mounted adjacent an edge thereof, the means for supporting including means for retaining said boards so that said edge of successive rearward ones of said boards extend past said edge of preceding frontward ones of said boards whereby said indicator means mounted on said boards can be visible from a point in front of the front-most board.

13. A printed circuit board chassis comprising means for supporting a plurality of printed circuit boards, each of the boards having electrical visual indicator means mounted adjacent an edge thereof, the means for supporting comprising means for retaining said boards at successively advanced locations relative to a plane orthogonal to the plane of the boards and parallel to one of said edges whereby said indicator means of all of the boards are visible from a position in front of the chassis which is in a plane parallel to the front-most printed circuit board.

* * * * *

UNITED STATES PATENT OFFICE
CERTIFICATE OF CORRECTION

PATENT NO. : 4,304,966
DATED : December 8, 1981
INVENTOR(S) : Patrick R. Beirn and Terrence H. Mathews It is certified that error appears in the above-identified patent and that said Letters Patent are hereby corrected as shown below:

Claim 10, line 1, after "claim" change "10" to ---9---.

Signed and Sealed this

Sixteenth Day of March 1982

[SEAL]

Attest:

Attesting Officer

GERALD J. MOSSINGHOFF
*Commissioner of Patents and Trademarks*